(12) United States Patent
Papandreou et al.

(10) Patent No.: US 11,221,911 B2
(45) Date of Patent: Jan. 11, 2022

(54) DATA RECOVERY DUE TO TRANSIENT EFFECTS IN NAND FLASH MEMORIES

(71) Applicant: International Business Machines Corporation, Armonk, NY (US)

(72) Inventors: Nikolaos Papandreou, Thalwil (CH); Charalampos Pozidis, Thalwil (CH); Nikolas Ioannou, Zurich (CH); Roman Alexander Pletka, Uster (CH); Sasa Tomic, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/599,159

(22) Filed: Oct. 11, 2019

(65) Prior Publication Data

US 2021/0109807 A1    Apr. 15, 2021

(51) Int. Cl.
| | |
|---|---|
| *G06F 11/10* | (2006.01) |
| *G11C 29/52* | (2006.01) |
| *G11C 16/04* | (2006.01) |
| *G11C 11/56* | (2006.01) |
| *G11C 16/26* | (2006.01) |
| *G11C 16/34* | (2006.01) |
| *G06F 11/22* | (2006.01) |

(52) U.S. Cl.
CPC ...... *G06F 11/1068* (2013.01); *G11C 11/5621* (2013.01); *G11C 16/0483* (2013.01); *G11C 16/26* (2013.01); *G11C 16/349* (2013.01); *G11C 29/52* (2013.01)

(58) Field of Classification Search
None
See application file for complete search history.

(56) References Cited

U.S. PATENT DOCUMENTS

| 5,333,295 | A | * | 7/1994 | Podkowa | ................. | G06F 1/14 |
|---|---|---|---|---|---|---|
| | | | | | | 711/211 |
| 5,416,782 | A | * | 5/1995 | Wells | ................... | G11C 29/44 |
| | | | | | | 714/719 |

(Continued)

FOREIGN PATENT DOCUMENTS

EP    0586768 A1 *  3/1994  ........... G06F 9/4825

OTHER PUBLICATIONS

Soin et al. Memory testing and fail bitmap generation for fault correlation, IEEE, Conference Paper, pp. 1-6. (Year: 2017).*

(Continued)

*Primary Examiner* — April Y Blair
*Assistant Examiner* — Dipakkumar B Gandhi
(74) *Attorney, Agent, or Firm* — Stephen R. Yoder

(57) ABSTRACT

A memory controller for recovering data due to transient effects of nonvolatile memory is provided. A memory controller receives a read request for a page stored in the nonvolatile memory. The memory controller issues a first read command. The memory controller records a time stamp for the first read command. In response to a failure during the first read command, the memory controller waits for a delay after the recorded time stamp and the memory controller issues a second read command to the page, wherein the second read command applies a read voltage offset that is dependent on the delay between the first read command and the second read command and at least one other parameter.

18 Claims, 7 Drawing Sheets

(56) References Cited

U.S. PATENT DOCUMENTS

| | | | | |
|---|---|---|---|---|
| 5,539,702 | A * | 7/1996 | Ahn | G11C 29/38 365/201 |
| 6,646,929 | B1 * | 11/2003 | Moss | G06F 13/4243 365/193 |
| 8,499,201 | B1 * | 7/2013 | Chiu | G06F 11/3037 714/46 |
| 10,101,931 | B1 | 10/2018 | Camp et al. | |
| 2001/0022754 | A1 * | 9/2001 | Pawlowski | G11C 7/1045 365/233.1 |
| 2002/0122341 | A1 * | 9/2002 | Perner | G11C 29/78 365/200 |
| 2004/0246772 | A1 * | 12/2004 | Lee | G11C 29/12 365/154 |
| 2010/0157673 | A1 * | 6/2010 | Ota | G11C 16/04 365/185.03 |
| 2012/0303871 | A1 * | 11/2012 | Tokiwa | G11C 29/44 711/103 |
| 2012/0311381 | A1 * | 12/2012 | Porterfield | G06F 11/2053 714/6.22 |
| 2016/0004437 | A1 * | 1/2016 | Kim | G11C 16/26 714/764 |
| 2017/0053714 | A1 | 2/2017 | Guy et al. | |
| 2017/0090802 | A1 * | 3/2017 | Margetts | G06F 3/0625 |
| 2019/0102097 | A1 * | 4/2019 | Madraswala | G06F 3/0679 |
| 2019/0267100 | A1 * | 8/2019 | Pan | G11C 16/26 |
| 2020/0089629 | A1 * | 3/2020 | Wang | G06F 3/0671 |
| 2020/0185045 | A1 * | 6/2020 | Chen | G11C 29/50012 |

OTHER PUBLICATIONS

Nair et al., Reducing read latency of phase change memory via early read and turbo read, IEEE, Conference Paper, pp. 309-319. (Year: 2015).*

Baltagi et al., Embedded memory fail analysis for production yield enhancement, IEEE, Conference Paper, pp. 1-5. (Year: 2011).*

Cai et al., "Experimental Characterization, Optimization, and Recovery of Data Retention Errors in MLC NAND Flash Memory", arXiv:1805.02819v1 [cs.AR] May 8, 2018, 11 pages.

Luo, Y., "Architectural Techniques for Improving NAND Flash Memory Reliability", arXiv:1808.04016v1 [cs.AR] Aug. 12, 2018, 263 pages.

* cited by examiner

DATA RECOVERY DUE TO TRANSIENT EFFECTS IN NAND FLASH MEMORIES

BACKGROUND OF THE INVENTION

The present invention relates generally to the field of NAND flash memories, and more particularly to recovering data due to transient effects in a nonvolatile memory.

Enterprise storage capacity requirements are growing continuously. At the same time, prices for flash storage units—e.g., SSDs (solid-state drive)—have decreased significantly in comparison to hard disk drive storage systems, so that the industry demand for NAND flash-based memory has increased significantly. The cell density of such NAND flash memories is also ever increasing and the number of bits that can be stored per memory cell is also ever increasing—e.g., after MLC (multi-level cell—for two bits per cell), TLC (triple-level cell for three bits per cell) or QLC (quad-level cell, for four bits per cell), etc.

A NAND flash memory block is known to be organized in word lines and bit lines. Each word line addresses cells that are programmed or read simultaneously. In 3D block structures, each block is further organized in layers that comprise multiple word line layers. Multi-level NAND flash technology stores more than one bit per memory cell by programming the threshold voltage (VTH) of each cell to multiple discrete levels, e.g., in MLC NAND there are 4 discrete levels, in TLC NAND there are eight discrete levels, and in QLC NAND there are 16 discrete levels. In order to program the cells in a word line, the respective controller needs to provide the information to be stored in all cells across the word line. By this, a page is defined, i.e., the memory page is the minimum addressable unit that comprises the bit information of the same significance from all cells of a word line.

SUMMARY

Embodiments of the present invention provide a method, memory controller, and program product to recover data due to transient effects in a nonvolatile memory. A memory controller for recovering data due to transient effects of nonvolatile memory is provided. A memory controller receives a read request for a page stored in the nonvolatile memory. The memory controller issues a first read command. The memory controller records a time stamp for the first read command. In response to a failure during the first read command, the memory controller waits for a delay after the recorded time stamp and the memory controller issues a second read command to the page, wherein the second read command applies a read voltage offset that is dependent on the delay between the first read command and the second read command and at least one other parameter.

DETAILED DESCRIPTION

Figure 1:
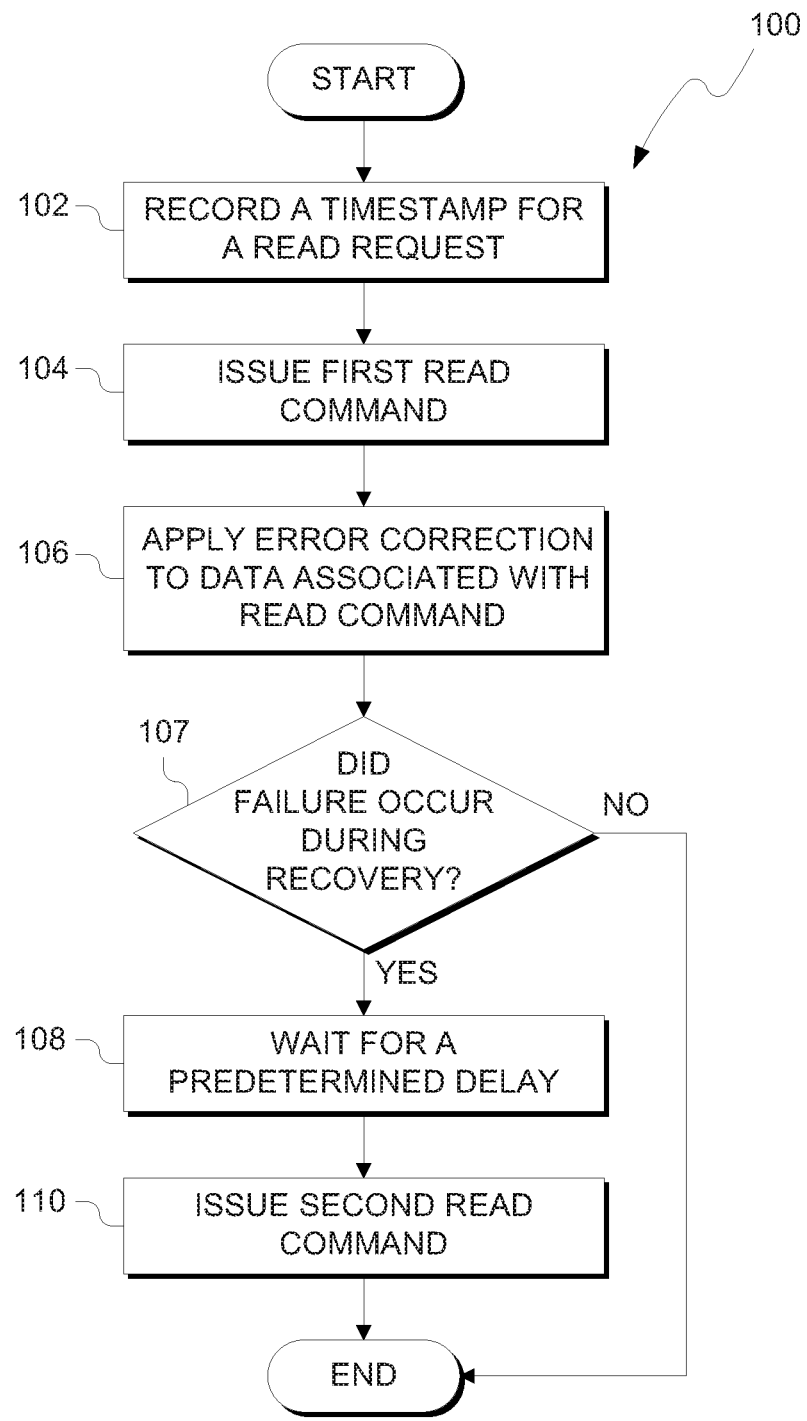
FIG. 1 illustrates operational processes of a memory controller, on a computing device within the environment of FIG. 7, in accordance with an exemplary embodiment of the present invention.

To program the cells of a multi-level NAND flash memory chip, the respective controller needs to provide the information for the multiple pages that share the particular word line, e.g., in MLC NAND (four distinct levels to be programmed), the controller needs to provide the lower page with least significant bits (LSB) of all cells related to the word line and the upper page with most significant bits (MSB). Typically, the different pages in the block are written based on a device-specific page programming order which may write data to a subsequent word line sequentially or in an interleaved way in an attempt to mitigate the cell-to-cell interference (CCI) effects caused when programming adjacent word lines, or adjacent layers in 3D NAND flash devices.

However, 3D NAND flash devices show a particular case of VTH transient effects. More specifically, the programmed VTH distributions become wider and may shift to higher VTH values due to an apparent charge gain or charge increase. This transient effect may result in a temporarily elevated raw bit error rate (RBER) which can result in unwanted data corruption.

Although this effect is observable in 3D MLC NAND flash devices, the effect may be larger in 3D TLC devices and (even more pronounced) in 3D QLC devices.

The transition from the lower RBER state to the higher RBER state may be triggered by time, or by array operations on other blocks, such as erase, program or read operations. The transition from the higher RBER state back to the lower RBER state may be triggered by a read operation on the target block or page. The read operation may be able to remove the extra (unwanted) charge in the cells. However, additional non-operation read operations (i.e., memory system initiated) have a negative effect on the performance of the NAND flash memory devices.

In the context of this description, the following conventions, terms and/or expressions may be used:

The term 'nonvolatile memory' or 'nonvolatile memory device' may denote here, a semiconductor device implemented as persistent memory, e.g. in the form of a 'multi-level NAND flash memory'. Such a memory device may be a device allowing storing more than one bit per memory cell. In the case of 3D NAND flash memory devices two, three or four bits may currently be stored per memory cell. However, it can be expected that more than four bits may be storable in one memory cell soon. The proposed concept may also apply to those NAND flash memory devices allowing more than four storable bits per memory cell. Devices allowing two bits per memory cell may be denoted as an MLC (multi-level cell) and may be enabled to store four different states (00, 01, 10, 11). TLCs (triple level cells) may allow eight different states, and QLC (quad-level cells) may allow 16 different states in a single memory cell.

The term 'block' or 'memory block' may denote a group of memory pages of a NAND flash memory device being addressable for a memory operation. It is known in the art that in NAND flash devices data are programmed on a page basis and are erased on a block basis.

The term 'page' or 'memory page' may denote a plurality of memory cells organized as a memory page, e.g., a NAND flash memory page. There may also be shared memory pages belonging to one word line in case of technologies which are able to store multiple bits per cell. Typical memory page sizes are 2 kB, 4 kB 8 kB or 16 kB. However, with increasing cell density also larger page sizes may be possible. The proposed concept may be applicable to any memory page size.

The term 'transient effects' may denote a shift effect over time for required read voltages or their respective offsets due to time or other side effects of other operations within the memory device. This may include array operations to other "nearby" memory blocks, such as erase or program or read operations, where the term "nearby" may denote memory blocks which are in the same die or plane or in physical proximity with the memory block that the target page belongs to.

The term 'time stamp' may denote a concrete time value with a predefined accuracy (e.g., 1 sec, 0.1 sec, 0.001 sec, or others). Timestamp values for specific read requests may be used here in order to control the functioning of the method.

The term 'read request' may denote a regular operation addressing the memory device in order to retrieve data stored in the memory device. The term 'read request' and 'read command' may be used interchangeably. However, it may be differentiated between a 'host read' request which may be initiated by a user space (or operating system space) driven process. On the other side, a read request may be denoted as 'background read' which may denote a read request generated within the memory controller in order to ensure a proper functioning of the memory device, in particular for error mitigation purposes.

The term 'error correction' may denote a process to detect and correct bit errors in a memory system. A plurality of ECC (error correction code) methods are known in the art. The proposed concept may work with any of the known ECC concepts.

The term 'delay' may denote a time difference between a first operational read request (i.e., the one with the related timestamp) and a related second read request for decreasing an error count during the first read operation from the address memory cells.

The term 'read voltage offset' may denote an adjustment in the required read voltages during a page read request to account for the changes in the threshold voltage distributions due to time (retention effects), program and erase cycling (aging effects), read operations (read-disturb effects), or other transient effects that may result in a widening and shifting of the threshold voltage distributions. Unfortunately, these effects may lead to higher RBER therefore the changes in the threshold voltage distributions have to be compensated. This compensation is done by read voltage offsets. Typically, the memory vendors provide special commands that allow the controller to program the read voltage offsets used in the NAND flash memory devices.

The term 'program/erase cycling history' may denote the number of program and erase operations to blocks of the memory device. As known, nonvolatile memory devices like multi-level NAND flash memory devices may show aging effects due to program/erase cycling operations.

The term 'lookup table' may denote a dedicated memory space—e.g., implemented as part of the memory controller—for storing time values (i.e., tDEL, Δt) that are dependent from a plurality of parameters. These parameters may comprise a page type and several others.

The term 'open page read request' may denote a plurality of host read requests that are in progress, i.e., they have not been completed, and for which at least a first read command has been issued. As it is known in the art, the maximum number of host read requests that can be serviced in parallel by the memory controller may depend on multiple parameters including the organization of the plurality of NAND flash memory devices to channels, the method of addressing the plurality of NAND flash memory devices within and across channels, etc.

The term 'error count' or 'error count value' may denote a counter value of type integer indicative of the number of bit errors of e.g., a memory page during a read request.

The term 'read disturb count' may denote a counter value of type integer indicative of the number of page read operations in a given block.

The proposed method for recovering data due to transient effects in a nonvolatile memory may offer multiple advantages, contributions and technical effects:

Embodiments of the present invention recognize that a proper read offset voltage may be used in order to read memory pages with the lowest possible error count. Additionally, the embodiments of the present invention may only generate a second read commands if a first read command fails to read a memory page with an error count low enough to be correctable, i.e., low enough such that an ECC check can be passed. In contrast to prior solutions and technologies, embodiments of the present invention do not rely on a timewise regular mitigation read command in order to remove unwanted charges from the memory cells. However, only if required, a second read command may be issued taking advantage of the fact that the first read command has initiated the transition to a lower RBER state. Using knowledge that the transition time to a minimum RBER state is dependent on at least the page type of the target page and a program/erase cycling history of the target block, a decision is taken to issue the second read command after a predetermined delay time from the first read command. Based on further knowledge that for a given delay time, the minimum RBER state is achieved with a given read voltage offset value, the proposed method uses a predetermined read voltage offset value to ensure the lowest possible error count after the second read command.

Additionally, embodiments of the present invention may also be combined with additional regular mitigation read commands.

In some embodiments, at least one other parameter may be selected out of the group comprising a page type (e.g., lower page type) of the nonvolatile memory and a program/erase cycling history. Also, other parameters may be reflected. Basically, all of these characteristic parameter values may have a different influence on the dynamics of the charging recharging process of individual cells and thus on the read voltage offset required for proper read operations.

In some embodiments, the nonvolatile memory may be a 3D MLC, TLC or QLC NAND flash memory device. Although the effect addressed with the proposed concept can be observed in MLC devices, it is much more pronounced in TLC and QLC devices. These devices have more threshold voltage levels and therefore, the margin between the adjacent threshold voltage distributions is reduced. Thus, these devices are more sensitive to the described shifting effect.

In some embodiments, the delay may be determined by using a lookup table using the predetermined delay time between the first read command and the second read command, a read disturb count, a program/erase cycle count and a page type as selection parameters. Using a lookup table may represent a very first way to determine the correct output values if a plurality of input values is given. No complex mathematical calculations may be needed. Consequently, no sophisticated calculation circuitry may be required.

In some embodiments, the predetermined delay time is counted for every open page read request of the NAND flash memory controller for which at least a first read command to the respective NAND flash chip has been issued. The maximum number of read requests that can be serviced in parallel by the memory controller is limited and may depend on multiple parameters including the organization of the plurality of NAND flash memory devices to channels, the method of addressing the plurality of NAND flash memory devices within and across channels, etc. Therefore, the maximum number of counters for counting the predetermined delay time for every open page read request is also limited and thus the added complexity is minimal.

In some embodiments, the read request may originate from a host read request. Thus, the method may completely be embedded into the normal operation of the memory device. Thus, this does not represent an additional burden in terms of computing costs for the memory device.

Some embodiments also comprise determining an error count of read data after the second read command, and upon determining uncorrectable read errors in the read data, trigger a higher level mitigation routine. Such a higher level mitigation routine may, e.g., be based on a RAID (redundant array of disks) schema. A skilled person will be able to select one of the RAID levels 0 to 7 to achieve the desired effect (e.g., RAID Level 6).

Some embodiments also comprise every host read command reading a timer value of the block a page to be read belongs to, determining (in particular, calculate) an elapsed time from the previous read operation—in particular, a previous host read over previous background read—to the same block, and storing the current time stamp in the timer of the block. This may enable a constant surveillance of cycles of read requests. Based on this knowledge it may be possible to adjust the read voltage offset according to the time between the read requests.

Hence, various embodiments also comprise applying a variable read voltage offset depending on the elapsed time in order to compensate shifting effects.

Some embodiments also comprise performing a background read to the block if no host read operation has been performed after a predetermined time period after the last read operation to that block. This way, it may be ensured that—if no host read request exists—system originating background read requests may be generated at fixed points in time, i.e., after predetermined time periods.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 shows a block diagram of a preferred embodiment of the method 100 for recovering data due to transient effects in a nonvolatile memory. The nonvolatile memory comprises a plurality of blocks and each block comprises a plurality of pages of memory cells. The method 100 comprises recording, 102, a time stamp upon receiving a read request—in particular an operational read in contrast to a background read or mitigation read—issuing, 104, a first host read, and applying, 106, an error correction process to the read data for recovering from wrongly read data.

In case it is determined that a failure happens during the recovery in 107 (i.e., an uncorrectable ECC operation), the method 100 comprises, waiting, 108, for a predetermined delay (tDEL, Δt) after the recorded time stamp, and issuing, 110, a second read command to the same page by applying a read voltage offset that is dependent on the delay between the first read command and the second read command and at least one other parameter. The parameters have been mentioned above already.

Figure 2:
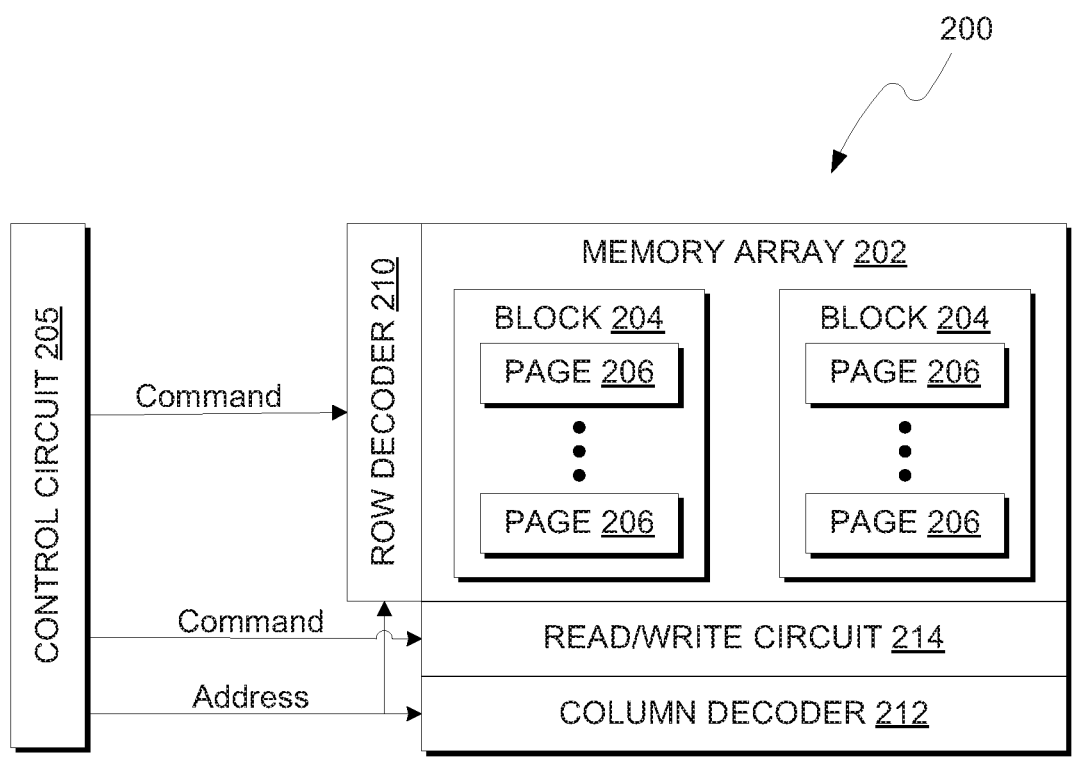
FIG. 2 is a functional block diagram illustrating a nonvolatile memory configuration.

FIG. 2 shows a block diagram an embodiment of a general setup for a nonvolatile memory or module 200. As is known to those skilled in the art, NAND flash memory, such as that employed in memory array 202, must be erased prior to being programmed. Furthermore, NAND flash memory can be (but is not required to be) constrained by its construction such that the smallest granule of storage that can be erased is a block 204 and the smallest granule of storage that can be accessed by a read or write request is fixed to the size of a single physical page 206. It should be appreciated in this regard that the LBAs (logical block address) provided by host devices correspond to logical pages within a logical address space, where each logical page typically has, e.g., a size of 4 kilobytes (kB). Physical pages 206, in contrast, typically have a larger size, for example, 16 kB, and can thus store multiple logical pages.

Flash memory module 200 further comprises a row decoder 210 through which word lines of a memory array 202 can be addressed, and a column decoder 212 through which bit lines of memory array 202 can be addressed. In addition, the flash memory module 200 comprises read/write circuitry 214 that enables the memory cells of a physical page 206 to be programmed or read. The flash memory module 200 additionally includes control circuitry 205 that provides chip-level control of operation of the memory array 202, including read and write accesses made to physical pages 206 in the memory array 202, erasure of blocks 204, and the amplitude, duration and polarity of related voltages applied to the memory array 202.

Figure 3:
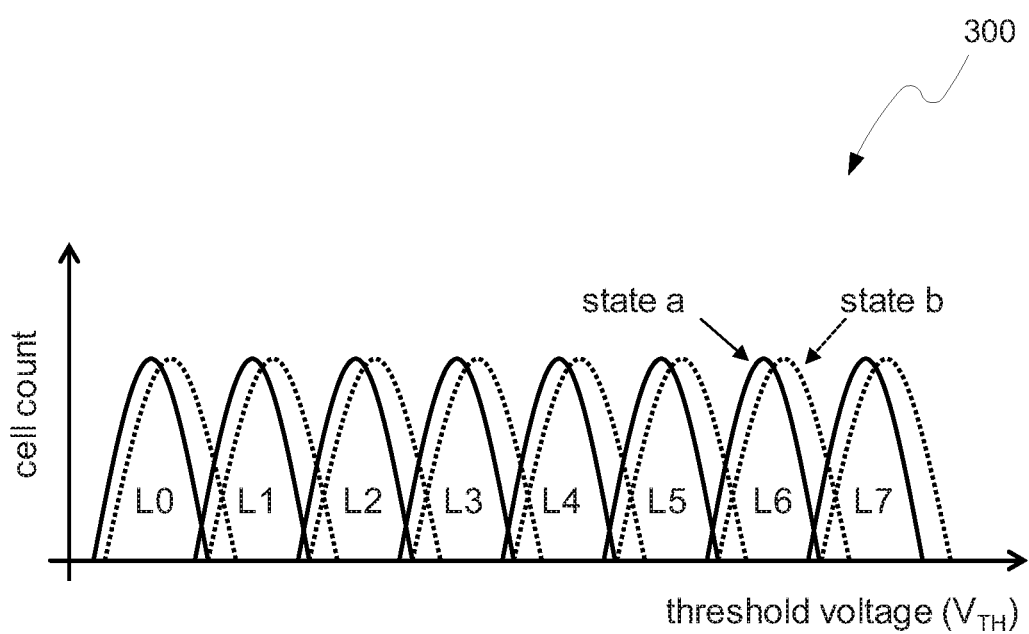
FIG. 3 shows a block diagram of a shift of threshold voltage distributions.

FIG. 3 shows a diagram 300 of a shift effect that happens to the read threshold voltages. The y-axis shows a cell count in a TLC NAND flash. The x-axis shows the threshold voltage ($V_{TH}$) for the different levels L0, L1, L2, . . . , L7. The solid parabolic lines relate to a first state a of lower RBER, and the dotted parabolic lines relate to a second state b of higher RBER. It turns out that the state b may result in more read errors than state a. The same effect can be observable for QLC NAND flash memory cells. Thus, the figure expresses the effect of right shifting of the threshold voltages. At the same time the threshold voltage distributions may become broader. The resulting effect may be different as a result of different manufacturing processes of the nonvolatile memory devices; however, it may be inherent to 3D NAND flash memory devices as a class of memory devices.

Figure 4:
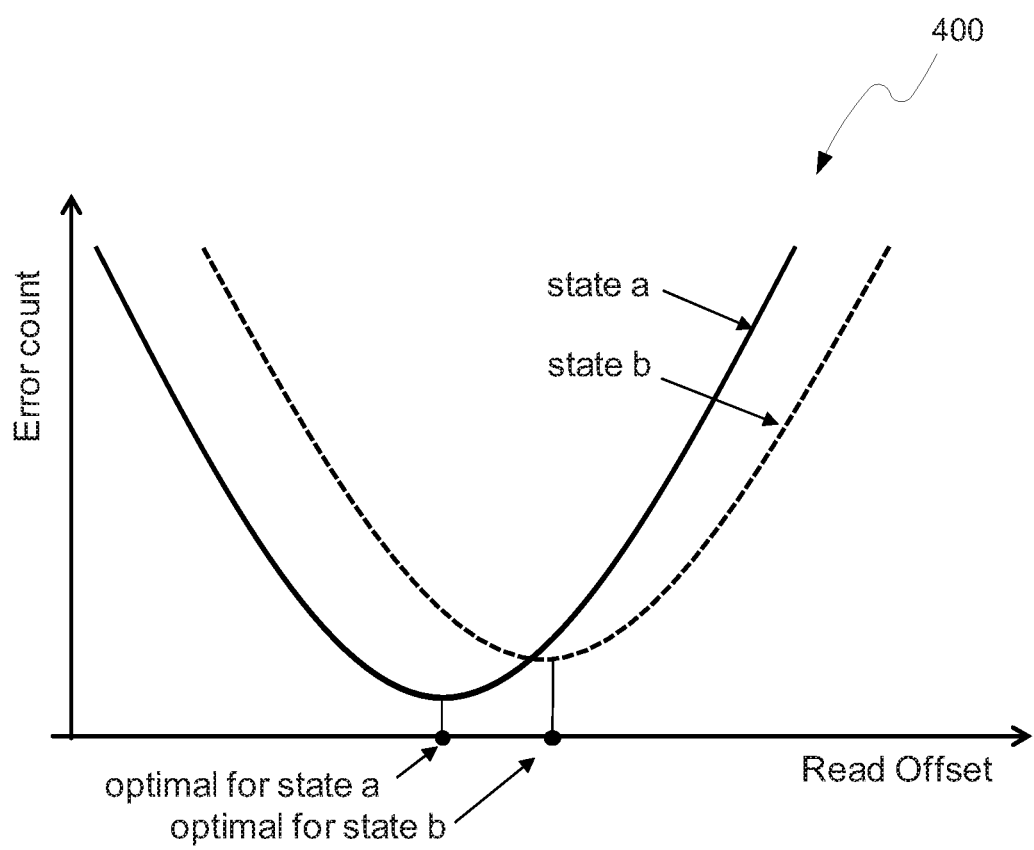
FIG. 4 shows a diagram of different read voltage offsets for different states of NAND flesh memory cells.

FIG. 4 shows a diagram 400 of required different read offset voltages for different states of 3D NAND flash memory cells. The y-axis shows the error count for a specific memory page and the x-axis shows an optimal read voltage offset for a related read command after different drift times. The minimum of the parabolic curves with exemplary states a, b denotes the optimal read offset voltage at a certain time after a last read operation to the same page or to the block that the target page belongs to. For example, the characteristic curve of state a may correspond to a time after a last read operation which is longer than the time that state b corresponds to. It is therefore apparent that a different read voltage offset is optimal depending on the delay time after a last read operation. Hence, it would be beneficial to ensure that the second read operation is issued at the shortest possible delay time and with the appropriate read voltage offset so that the probability to read the target page at a low error count is maximized.

Figure 5:
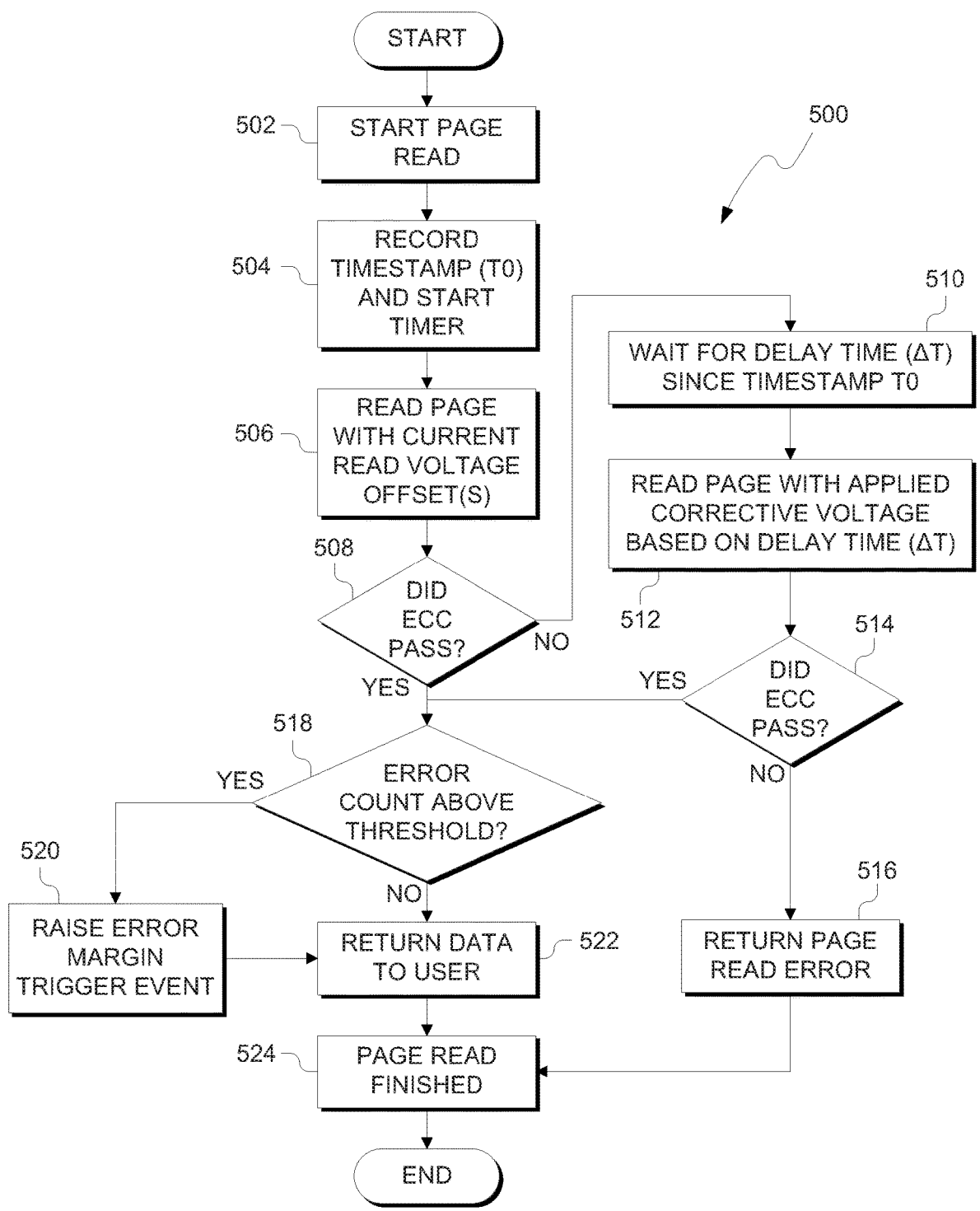
FIG. 5 shows a block diagram for a flow chart of a more comprehensive version of the here proposed method.

FIG. 5 shows a block diagram 500 for a flow chart of a more comprehensive version of the here proposed method. The process starts with a received host request (502). The host request may be differentiated from a background read request which may be initiated to perform background read operations such as dummy reads or proactive reads.

A timestamp (t0) is recorded, 504, and a timer is started. The page addressed is read, 506, with the current read voltage offset(s), and it is determined, 508, whether an error correction code procedure can be passed with a positive outcome—case "yes" of the determination 508. If it is also determined, 518 that an error count is above a predefined threshold value for the page—case "yes" of the determination 518—an error margin trigger event is raised, 520, which may initiate further error handling mechanism in the background, such as recalibration of read voltages, and the corrected data are returned to the host, 522. The process ends at 524.

If the ECC check is not passed in the determination 508, the process waits, 510, for a predefined delay time (tDEL, Δt) since the timestamp (t0) and a corrective read voltage offset is applied, 512, dependent on the delay time, a page type, a program/erase cycle history and other potential parameters, i.e., before reading the target page for a second time.

The corrective read offset voltages may be determined by predefined and stored lookup table values that relate the optimal offset with the delay time, the page type, the program/erase history of the block, the retention time of the block, etc.

Again, an ECC check may be performed and it may be determined, 514, whether the read page can pass the ECC check and if that is not the case—case "no"—a page read error is returned, 516, and the process ends again at 524. However, if at the determination 514 the ECC check has a positive result—case "yes"—the process returns to the main process path and to the determination 518 whether the error count is above a predefined threshold value.

Figure 6:
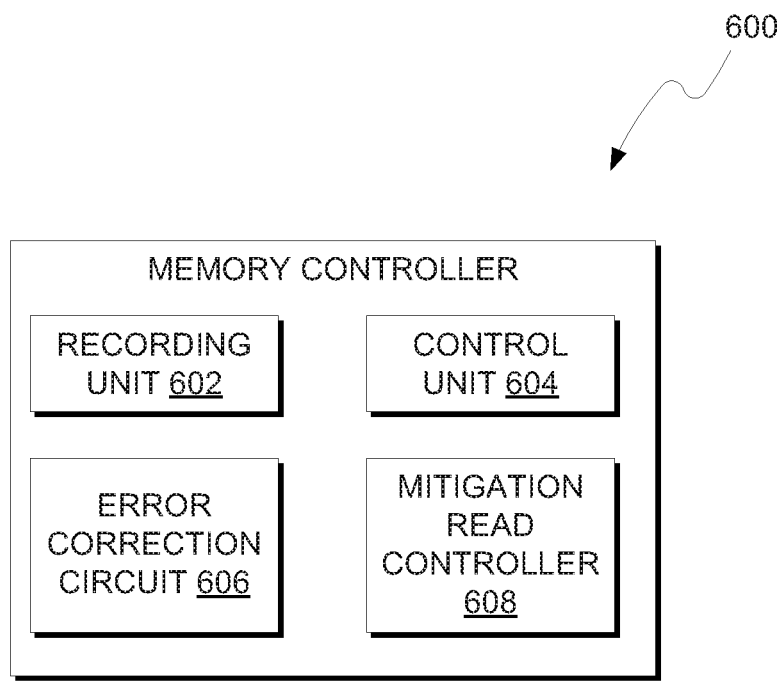
FIG. 6 illustrates operational processes of a memory controller for recovering data due to transient effects in a nonvolatile memory, on a computing device within the environment of FIG. 7, in accordance with an exemplary embodiment of the present invention.

For reasons of completeness, FIG. 6 shows a block diagram of an embodiment of the memory controller 600 for recovering data due to transient effects in a nonvolatile memory. Again, the nonvolatile memory comprises a plurality of blocks, each of which comprises a plurality of pages of memory cells. The memory controller 600 comprises a recording unit 602 adapted for recording a time stamp upon receiving a read request, a control unit 604 adapted for issuing a first read command, and an error correction circuit 606 adapted for applying error correction to the read data for recovering from wrongly read data.

Furthermore, the memory controller 600 comprises a mitigation read controller 608 adapted for a determination whether a failure occurred during the recovering, wherein the mitigation read controller is also adapted for waiting for a predetermined delay, and issuing a second read command to the same page by applying a read voltage offset that is dependent on the delay between the first read command and the second read command and at least one other parameter.

Figure 7:
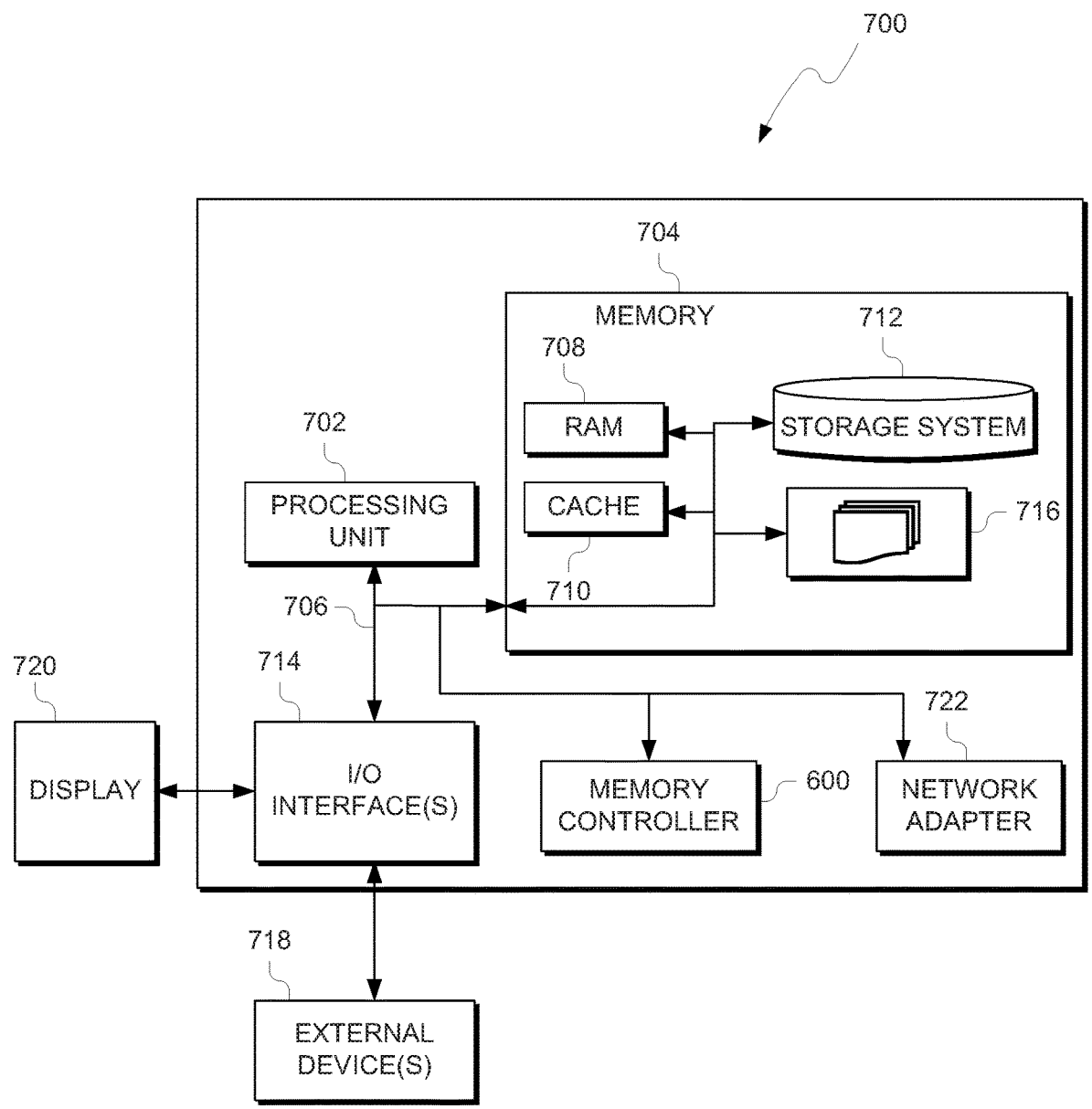
FIG. 7 depicts a block diagram of components of the computing device including a memory controller, in accordance with an exemplary embodiment of the present invention.

Embodiments of the invention may be implemented together with virtually any type of computer, regardless of the platform being suitable for storing and/or executing program code. FIG. 7 shows, as an example, a computing system 700 with the memory controller 600 suitable for executing program code—e.g., microcode for the nonvolatile memory—related to the proposed method.

The computing system 700 is only one example of a suitable computer system, and is not intended to suggest any limitation as to the scope of use or functionality of embodiments of the invention described herein, regardless, whether the computer system 700 is capable of being implemented and/or performing any of the functionality set forth hereinabove. In the computer system 700, there are components, which are operational with numerous other general purpose or special purpose computing system environments or configurations. Examples of well-known computing systems, environments, and/or configurations that may be suitable for use with computer system 700 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system 700 may be described in the general context of computer system-executable instructions, such as program modules, being executed by a computer system 700. Generally, program modules may include routines, programs, objects, components, logic, data structures, and so on that perform particular tasks or implement particular abstract data types. Computer system 700 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system 700 is shown in the form of a general-purpose computing device. The components of computer system 700 may include, but are not limited to, one or more processors or processing units 702, a system memory STORAGE SYSTEM, and a bus 706 that couple various system components including system memory 704 to the processing units 702. Bus 706 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system 700 typically includes a variety of computer system readable media. Such media may be any available media that is accessible by computer system 700, and it includes both, volatile and nonvolatile media, removable and non-removable media.

The system memory 704 may include computer system readable media in the form of volatile memory, such as random access memory (RAM) 708 and/or cache memory 710. Computer system 700 may further include other removable/non-removable, volatile/nonvolatile computer system storage media. By way of example only, a storage system 712 may be provided for reading from and writing to a non-removable, nonvolatile magnetic media (not shown and typically called a 'hard drive'). Although not shown, a magnetic disk drive for reading from and writing to a removable, nonvolatile magnetic disk (e.g., a 'floppy disk'), and an optical disk drive for reading from or writing to a removable, nonvolatile optical disk such as a CD-ROM, DVD-ROM or other optical media may be provided. In such instances, each can be connected to bus 706 by one or more data media interfaces. As will be further depicted and described below, memory 704 may include at least one program product having a set (e.g., at least one) of program modules that are configured to carry out the functions of embodiments of the invention.

The program/utility, having a set (at least one) of program modules 716, may be stored in memory 704 by way of example, and not limiting, as well as an operating system, one or more application programs, other program modules, and program data. Each of the operating systems, one or more application programs, other program modules, and program data or some combination thereof, may include an implementation of a networking environment. Program modules 716 generally carry out the functions and/or methodologies of embodiments of the invention, as described herein.

The computer system 700 may also communicate with one or more external devices 718 such as a keyboard, a pointing device, a display 720, etc.; one or more devices that enable a user to interact with computer system 700; and/or any devices (e.g., network card, modem, etc.) that enable computer system 700 to communicate with one or more other computing devices. Such communication can occur via Input/Output (I/O) interfaces 714. Still yet, computer system 700 may communicate with one or more networks such as a local area network (LAN), a general wide area network (WAN), and/or a public network (e.g., the Internet) via network adapter 722. As depicted, network adapter 722 may communicate with the other components of the computer system 700 via bus 706. It should be understood that, although not shown, other hardware and/or software components could be used in conjunction with computer system 700. Examples, include, but are not limited to: microcode, device drivers, redundant processing units, external disk drive arrays, RAID systems, tape drives, and data archival storage systems, etc.

Additionally, memory controller 600 for a nonvolatile memory for recovering data due to transient effects may be attached to the bus 706.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

What is claimed is:

1. A method for recovering data due to transient effects in a nonvolatile memory, the method comprising:
   receiving a read request for a page stored in the nonvolatile memory;
   issuing a first read command;
   recording a time stamp for the first read command; and
   in response to a failure during the first read command,
      waiting for a delay after the recorded time stamp, wherein the delay is determined by a lookup table using a predetermined delay time between the first read command and a second read command, a read disturb count, a program/erase cycle count and a page type as selection parameters; and
      issuing the second read command to the page, wherein the second read command applies a read voltage offset that is dependent on the delay between the first read command and the second read command and at least one other parameter.

2. The method of claim 1, wherein the at least one other parameter includes at least one of the following parameters: (a) group comprising a page type of the nonvolatile memory or (b) a program/erase cycling history.

3. The method of claim 1, wherein the nonvolatile memory is multi-level cell (MLC), triple-level cell (TLC) or quad-level cell (QLC) flash memory.

4. The method of claim 1, wherein a predetermined delay time is counted for every open page read request of a NAND flash memory controller.

5. The method of claim 1, wherein the read request originates from a host read request.

6. The method of claim 1, the method further comprising:
   determining an error count of read data after the second read command; and
   upon determining uncorrectable read errors in the read data triggering a higher level mitigation routine.

7. The method of claim 1, the method further comprising:
   reading a timer value of a block for the read request;
   determining an elapsed time from a previous read operation; and
   storing a current time stamp in the timer of the block.

8. The method of claim 7, the method further comprising:
   applying a variable read voltage offset depending on the elapsed time.

9. The method of claim 8, the method further comprising:
   performing a forced read to the block if no host read operation has been performed after a predetermined time period after the last read operation.

10. A memory controller for a nonvolatile memory for recovering data due to transient effects, the controller comprising:
    a recording unit adapted for recording a time stamp upon receiving a read request for a page;
    a control circuit adapted for issuing a first read command;
    an error correction circuit configured to apply error correction to read data; and
    a mitigation read controller configured to determine whether a failure occurred during the first read command, wherein the mitigation read controller is configured to:
       wait for a predetermined delay, wherein the delay is determined by a lookup table using a predetermined delay time between the first read command and a second read command, a read disturb count, an erase disturb count and a page type as selection parameters; and
       issue the second read command to the page by applying a read voltage offset that is dependent on the delay between the first read command and the second read command and at least one other parameter.

11. The controller of claim 10, wherein the at least one other parameter is selected out of a group comprising a page type of the nonvolatile memory, a program/erase cycling history.

12. The controller of claim 10, wherein the nonvolatile memory is multi-level cell (MLC), triple-level cell (TLC) or quad-level cell (QLC) flash memory.

13. The controller of claim 10, wherein the recording unit is configured to record the predetermined delay time for every open page read request of a NAND flash memory.

14. The controller of claim 10, wherein the read request originates from a host read request.

15. The controller of claim 10, the controller further comprising:
    an error counter configured to:
       determine an error count of read data after the second read command, and
       in response to determining an uncorrectable read error value exceeds a threshold, triggering a higher level mitigation routine.

16. The controller of claim 15, the controller further comprising:
    a mitigation read controller configured to:
        reading a timer value of a block a page to be read belongs to;
        determining an elapsed time from a previous read operation;
        storing a current time stamp in the timer of the block; and
        applying a variable read voltage offset depending on the elapsed time.

17. The controller of claim 16, wherein the mitigation read controller is also configured to perform a forced read to the block based on a predetermined time period after the last read operation.

18. A computer program product for recovering data due to transient effects in a nonvolatile memory, the computer program product comprising:
    one or more computer-readable storage medium and program instructions stored on the one or more computer-readable storage medium, the program instructions comprising:
        program instructions to receive a read request for a page stored in the nonvolatile memory;
        program instructions to issue a first read command;
        program instructions to record a time stamp for the first read command; and
        in response to a failure during the first read command,
            program instructions to wait for a delay after the recorded time stamp, wherein the delay is determined by a lookup table using a predetermined delay time between the first read command and a second read command, a read disturb count, an erase disturb count and a page type as selection parameters; and
            program instructions to issue the second read command to the page, wherein the second read command applies a read voltage offset that is dependent on the delay between the first read command and the second read command and at least one other parameter.

* * * * *